United States Patent [19]
Goesele et al.

[11] Patent Number: 6,150,239
[45] Date of Patent: Nov. 21, 2000

[54] METHOD FOR THE TRANSFER OF THIN LAYERS MONOCRYSTALLINE MATERIAL ONTO A DESIRABLE SUBSTRATE

[75] Inventors: Ulrich M. Goesele; Qin-Yi Tong, both of Durham, N.C.

[73] Assignee: Max Planck Society, Munich, Germany

[21] Appl. No.: 09/163,897

[22] Filed: Sep. 30, 1998

Related U.S. Application Data

[63] Continuation-in-part of application No. 08/866,951, May 3, 1997, Pat. No. 5,877,070.
[51] Int. Cl.[7] .................................................. H01L 21/304
[52] U.S. Cl. ............................ 438/458; 438/406; 117/915
[58] Field of Search ...................... 438/406, 407, 438/458, 222, FOR 262, FOR 106, FOR 246, FOR 477; 117/915; 148/DIG. 12, DIG. 135

[56] References Cited

U.S. PATENT DOCUMENTS

| | | |
|---|---|---|
| 4,883,215 | 11/1989 | Stengl et al. . |
| 5,024,723 | 6/1991 | Goesele et al. . |
| 5,374,564 | 12/1994 | Bruel . |
| 5,882,987 | 3/1999 | Srikrishnan . |

OTHER PUBLICATIONS

M. Bruel, "Silicon on insulator material technolgy", Electronic Letters vol. 31, (1995) pp. 1201–1202.

L. Di Cioccio, Y. Le Tiec, F. Letertre, C. Jaussaund and M. Bruel, "Silicon carbide on insulator formation using the Smart Cut process", Electronic Letters, vol. 32 (1996) pp. 1144–1145.

N. W. Cheung, "Plasma immersion ion implantation for semiconductor processing", Materials Chemistry and Physics, vol. 46 (1996), pp. 132–139.

L. B. Freund, "A lower bound on implant density to induce wafer splitting in forming compliant substrate structures", Applied Physics Letters, vol. 70 (1997), pp. 3519–3521.

Aditya Agarwal, T. E. Haynes, V. C. Venezia, O. W. Holland, and D. J. Eaglesham, "Efficient production of silicon–on–insulator films by co–implantation of He$^+$ with H$^+$" Applied Physics Letters, vol. 72 (1998), pp. 1086–1088.

*Primary Examiner*—George Fourson

[57] ABSTRACT

A method for transferring of monocrystalline, thin layers from a first monocrystalline substrate onto a second substrate, with a reduced requirement with respect to the hydrogen dose needed for layer splitting is realized by co-implantation of hydrogen-trap inducing ions with hydrogen ions, by the high temperature implantation of hydrogen, and by their combination, followed by a heat-treatment to weaken the connection between the implanted layer and the rest of the first substrate, then forming a strong bond between the implanted first substrate and the second substrate and finally using another heat-treatment in order to split the monocrystalline thin layer from the rest of the first substrate by the formation, and growth of hydrogen filled microcracks.

31 Claims, 5 Drawing Sheets

METHOD FOR THE TRANSFER OF THIN LAYERS MONOCRYSTALLINE MATERIAL ONTO A DESIRABLE SUBSTRATE

This is a continuation-in-part application of previous application Ser. No. 08/866,951 filed on May 31, 1997, and entitled METHOD FOR THE TRANSFER OF THIN LAYERS OF MONOCRYSTALLINE MATERIAL ONTO A DESIRABLE SUBSTRATE, now U.S. Pat. No. 5,877,070, and the disclosure of which is incorporated as if fully set forth herein. Priority under 35 U.S.C.120 for application Ser. No. 08/866,951 is hereby claimed. This continuation-in part application contains an 31 new claims and three new preferred embodiments identified as Third, Fourth, and Fifth Preferred Embodiments.

BACKGROUND OF THE INVENTION

The present invention relates to a method for transferring a thin layer of monocrystalline material from a first monocrystalline substrate to a second substrate, the transferred thin layer being initially an upper portion of the first substrate. In this method the lower portion of the first substrate remains and can be used to produce additional thin layers for subsequent transfer. For many applications, especially in the area of semiconductors, monocrystalline material is required in order to fabricate high performance microelectronic or optoelectronic devices. In many such applications it is only required that a thin surface layer, on the order of 10 nanommeters to a several micrometers, consists of the monocrystalline material while the rest of the body can consist of any appropriate substrate. Only if the substrate upon which the epitaxial layer formed is both monocrystalline and has a lattice constant which is close to that of the surface on which it is formed can such an epitaxial layer be grown by well established epitaxial methods. In the invention disclosed here the second substrate can have either a very different lattice constant or can be polycrystalline or even amorphous or can be monocrystalline and covered with an amorphous or polycrystalline layer. In previous inventions the fabrication of a layer of monocrystalline material on a second substrate is not possible by layer transfer if the thermal expansion coefficients of the two substrates do not closely match. The transfer of the thin monocrystalline layer from an appropriate monocrystalline first substrate with the same lattice constant as the monocrystalline layer to a second substrate, whose lattice constant is different from that of the first substrate, by means of this bonding approach together with the subsequent removal of the first substrate minus the thin transferred layer avoids the need for epitaxial growth on the second substrate. The monocrystalline first substrate may consist of the same material as the monocrystalline layer to be transferred or it may consist of a different monocrystalline material but still with nearly the same lattice constant. The bonding may either be anodic bonding, in which case the second substrate can be a glass with a sufficiently high electrical conductivity, or the bonding may be direct wafer bonding as disclosed by Stengl and Goesele in U.S. Pat. No. 4,883,215 or the bonding can be by still other methods.

In silicon-on-insulator material, the thin monocrystalline layer consists of monocrystalline silicon and the second substrate consists of an oxidized silicon wafer in which the silicon wafer is covered by an amorphous oxide layer. In this case the monocrystalline silicon layer is initially a part of the first substrate, which consists of a monocrystalline silicon wafer usually covered by a thin oxide layer or a purposely grown amorphous oxide layer which is bonded to the second substrate, which also consists of a monocrystalline silicon wafer covered by an oxide layer. The removal of the silicon wafer up to the thin layer can be accomplished by various methods, such as precision grinding and polishing or etching down to an etch-stop layer introduced by epitaxial methods, by ion-implantation of boron or carbon as disclosed by Goesele and Lehmann in U.S. Pat. No. 5,024,723 or by other appropriate methods. All of these methods have in common the result that the removed substrate is lost.

Bruel, in U.S. Pat. No. 5,374,564, disclosed a process for the production of thin semiconductor material films that is based on hydrogen implantation before bonding and subsequent heating after bonding, this heating after bonding being required to be at temperatures higher than the temperature at which the hydrogen is implanted. According to Bruel's patent this process leads to the transfer of a thin semiconductor layer, the thickness of which is defined by the maximum in the concentration of implanted hydrogen. The layer transfer process was also described by Bruel in U.S. Pat. No. 5,374,215 and also in his paper entitled "Silicon on insulator material technology", which was published in Electronic Letters. in volume 31 in 1995 on pages 1201 to 1202 and in the paper by L. Di Cioccio, Y. Le Tiec, F. Letertre, C. Jaussaud and M. Bruel entitled "Silicon carbide on insulator formation using the Smart Cut process", which they published in Electronic Letters, in volume 32 in 1996 on pages 1144 to 1145.

Thin, monocrystalline silicon layers on an oxidized silicon substrate, thin monocrystalline silicon layers on a glass substrate with a thermal expansion coefficient close to that of silicon and thin monocrystalline silicon carbide layers on a glass or on oxidized silicon substrate have been realized by wafer bonding of hydrogen implanted monocrystalline silicon substrates and a subsequent heat treatment which causes the separation of a thin layer from the first substrate by the formation, growth and coalescence of hydrogen filled microcracks essentially parallel to the bonding interface and final macroscopic splitting at a location close to the maximum in the concentration of the implanted hydrogen whereby the monocrystalline thin layer is transferred to the second substrate. However, only in cases where only a small or no difference in the thermal expansion coefficients exists between the first substrates (as, for example, silicon or silicon carbide wafers) and the second substrates to which they are to be bonded is the method described by Bruel possible. Other material combinations such as silicon (as the first substrate ) and fused quartz (as the second substrate) suffer fracture from thermal stresses due to thermal mismatch between the two dissimilar substrates during the required transfer heat-treatment thermal splitting step. Once the thin layer is separated or split off the hydrogen implanted first substrate, a subsequent high temperature treatment would be allowed as long as the layer thickness is below a critical value, which depends on the specific material combination. For example, in the case of silicon on quartz, or gallium arsenide on silicon, or indium phosphide on silicon, the thermal expansion coefficient of silicon is $2.6 \times 10^{-6}/°$ C. while that of synthetic quartz is only $0.5 \times 10^{-6}/°$ C., that of gallium arsenide is $6.8 \times 10^{-6}/°$ C. and that of indium phosphide is $4.8 \times 10^{-6}/°$ C. at room temperature. A wafer bonded 4"-diameter standard silicon/quartz pair (both of ~525 μm in thickness), is found to crack at temperatures as low as 220 degrees centigrade. Since with monocrystalline silicon as the hydrogen implanted first substrate, the transfer heat-treatment temperature in the process disclosed by Bruel typically is above approximately 500 degrees centigrade, the hydrogen implanted silicon substrate in the bonded silicon/ quartz pair has to be thinned down to less than about 150 μm to avoid cracking of the bonded pair during the layer-splitting heat-treatment. In this case a main advantage of the process disclosed by Bruel is lost, because extensive lapping and etching to remove most of the first substrate is needed. In the method of the present invention the first substrate, from which the Si layer is transferred, can be reused. The high splitting temperature required for the thin layer transfer in the process disclosed by Bruel practically prevents the economical application of the method to transfer monocrystalline thin layers onto a dissimilar substrate with a substantially different thermal expansion coefficient.

Hydrogen induced microcracks are not all at exactly the same depth and are distributed around the maximum in the concentration of implanted hydrogen. Therefore, a certain roughness after the layer transfer results, which limits the thickness uniformity of the transferred film and requires an additional polishing step. The remaining surface roughness is especially difficult to remove for very hard materials, such as silicon carbide for which the layer transfer by hydrogen implantation induced microcracks has also been shown to work. The transfer of thin monocrystalline layers of very expensive materials such as silicon carbide to appropriate less expensive substrates such as polycrystalline silicon carbide is especially interesting for economic reasons since then one monocrystalline substrate can be used to fabricate many mononocrystalline layers of the same area as the original substrate. This process is only economical if the required polishing of the surfaces after the hydrogen microcrack induced layer transfer is not extensive. Another disadvantage associated with the layer transfer method induced by hydrogen implantation as presently practiced is the generation of extensive damage regions, which are still present after the layer transfer process and which have to be annealed out at a much higher temperatures after the layer-splitting process.

In the case of the transfer of thin monocrystalline layers from one monocrystalline substrate to another substrate having an equal or similar coefficient of thermal expansion, a method for performing the final splitting process at a low temperature is needed if at least one of the substrates contains temperature sensitive structures. A sufficiently low splitting temperature in combination with appropriate other processing steps leads to a reduced microroughness of the surface of the transferred layer due to a smaller depth distribution of hydrogen induced microcracks or to less hydrogen implantation induced damage remaining after the layer transfer.

In the case of the transfer of a monocrystalline layer to a substrate of very different thermal expansion coefficient as, for example, in the transfer of a monocrystalline silicon layer to a fused quartz glass substrate for application in flat panel displays, it is desirable to restrict the temperature necessary for the process of splitting by the overlap of microcracks to as low a temperature as possible and to avoid as much implantation induced damage as possible.

SUMMARY OF THE INVENTION

The present invention relates to a method for the transfer of a thin monocrystalline layer from an essentially flat and mirror polished first substrate onto an essentially flat and mirror polished second substrate. According to this present invention, this second substrate can be silicon, oxidized silicon, glass, fused quartz, sapphire, and silicon carbide, as well as other materials and the first substrate can be silicon carbide, silicon, germanium, diamond, germanium, and alloys essentially of silicon and germanium with carbon, as well as other materials.

This method allows the transfer of the thin layer at temperatures lower than those possible using the present state of the art. Both substrates can be covered by one or more surface coating layers. The first substrate can either be a bulk monocrystalline material or a layered monocrystalline substrate structure, as, for example, one consisting of at least one epitaxial layer on a monocrystalline material or thin polycrystalline surface layers and amorphous surface layers or III–V compound epitaxial layers on a crystalline substrate. The first substrate and the second substrate can consist of materials with substantially the same or with very different coefficients of thermal expansion. According to the present invention the transfer of the thin layer, which can be a monocrystalline layer or essentially a polycrystalline thin layer or even essentially an amorphous thin layer or combinations thereof is performed at a temperature at which the two substrates, after they have been bonded, do not suffer from any degradation, especially degradation in one or both substrates or due to the mechanical stresses between the first and the second substrate caused by a difference in the thermal expansion coefficients during the heat-treatment during the transfer process.

In a first step in this new process, a hydrogen trap-inducing implantation of an element, which can be boron, carbon, phosphorus, nitrogen, arsenic or fluorine into a first monocrystalline substrate is carried out to create a disordered layer at depth close to the average desired thickness of the thin monocrystalline layer to be transferred. The element concentration maximum essentially divides the first substrate into an upper portion, which is the portion to be transferred as a layer and a lower portion, this lower portion containing the majority of the first substrate. The upper portion can also be, for example, an epitaxial layer that has been grown on a silicon wafer. This implantation step must be carried out at a temperature which is below that temperature at which implantation-induced hydrogen-traps are annealed. This disordered region then contains defects which are able to trap hydrogen in different configurations. The implantation conditions must be chosen in such a way that the maximum in the depth profile of the concentration of this element is close to the corresponding maximum in the concentration profile of the subsequently implanted hydrogen. The number of displaced atoms generated in the first substrate due to the hydrogen trap-inducing implantation must be close to or higher than the number of hydrogen nuclei implanted into the first substrate in the subsequent hydrogen implantation, and implantation-induced amorphization of the first substrate up to its surface must be avoided. The temperature of the first substrate during the hydrogen trap-inducing implantation must be kept below the temperature at which annealing out of the generated defects takes place. The preferred range for the trap-inducing implantation is a dose of less than $5\times10^{16}$ per square centimeter but greater than $1\times10^{13}$ per square centimeter;

In a second step a hydrogen implantation is carried out which forms a hydrogen concentration depth profile with a maximum close to that of the element concentration depth profile and also creates defects. The implanted hydrogen is chosen among normal hydrogen in the form of $H^+$ or $H_2^+$ or deuterium in the form of $D^+$ or $D_2^+$. The temperature of the first substrate during the hydrogen implantation must be kept below the temperature at which significantly annealing out of the generated defects by the hydrogen trap-inducing implantation takes place.

In a third step the first substrate is subjected to a sensitizing heat-treatment at an elevated temperature for a given time, which is chosen such that the hydrogen in the first substrate which was introduced by the hydrogen implantation is partly released from its attachments to the defects which were generated by the hydrogen trap-inducing implantation and as well by the hydrogen implantation itself. This treatment causes the formation and growth of hydrogen filled microcracks at a depth close to the maximum in the concentration depth profile of implanted hydrogen but must not cause hydrogen induced surface blisters, which would prevent subsequent bonding of the first substrate to a second substrate.

In a fourth step an intimate and strong bond between the first substrate and the second substrate is realized by direct wafer bonding or anodic bonding.

In a fifth step the bonded structure, consisting of the first and the second substrate as bonded is heat-treated at a transfer temperature at which the implanted hydrogen in the first substrate is fully released from their attachments to the defects which were generated by the hydrogen trap-inducing implantation as well as by the hydrogen implantation itself, to cause growth, overlapping and coalescence of of hydrogen-filled microcracks, which split the monocrystalline thin layer from the rest of the first substrate thereby transferring the thin monocrystalline layer to the second substrate. This transfer thermal treatment must be carried out at a transfer temperature lower than that temperature at which the bonded pair suffers any degradation of temperature sensitive structures in one or both substrates or, in the case of substrates with substantially different thermal expansion coefficients such as fused quartz and monocrystalline silicon, due to the mechanical stresses caused during the heat-treatment by the different thermal expansion coefficients

The process can also consist in skipping the hydrogen trap-inducing element implantation as well as the sensitizing heat-treatment and carrying out the hydrogen implantation at a temperature which is higher than the temperature of the transfer heat-treatment. In previous processes involving hydrogen implantation and layer transfer as disclosed by Bruel the implantation was always performed at lower temperatures than the transfer process itself based on the assumption that the layer transfer process would naturally require a higher temperature than the implantation temperature since otherwise the microcracks would develop already during implantation which could then cause the surface above these microcracks to bulge up and form surface blisters which then in turn would prevent the bonding procedure which requires flat and mirror polished surfaces of good quality to be successfully performed.

Figure 1:
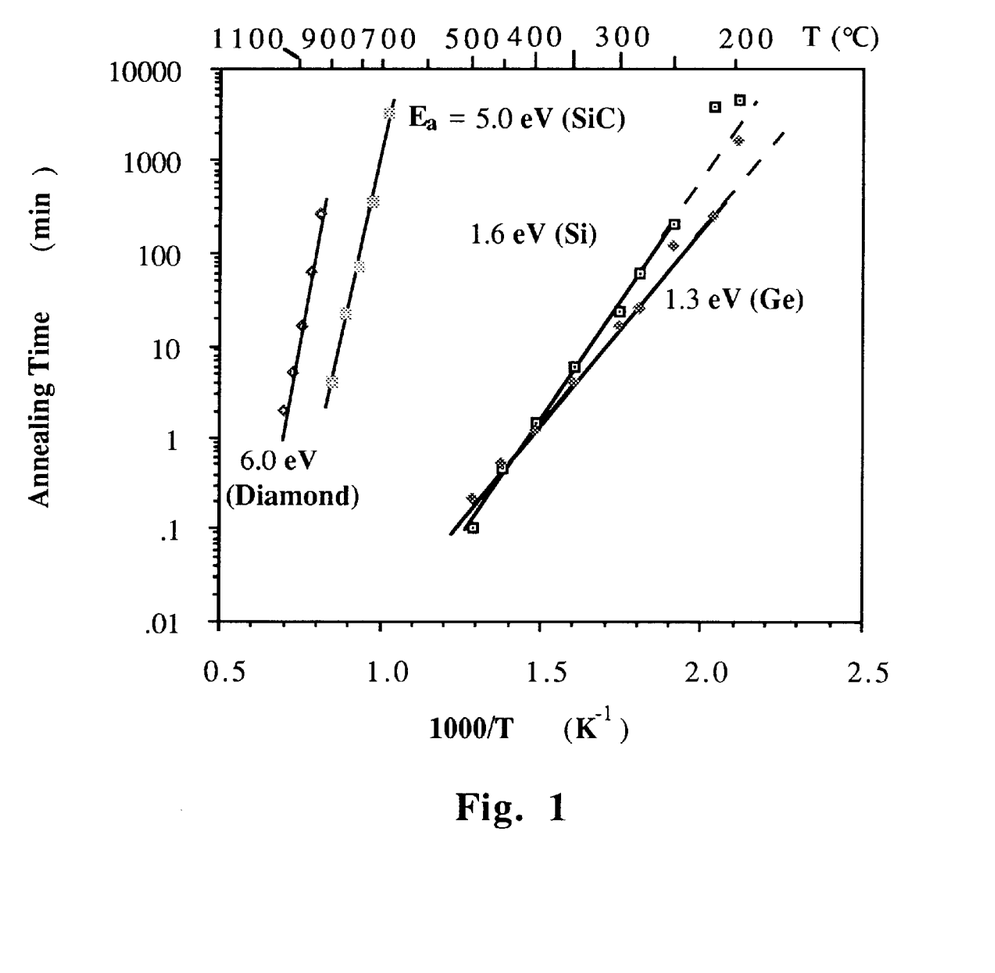
FIG. 1 Time required to form hydrogen-induced optically detectable surface blisters in room-temperature hydrogen-implanted silicon, germanium, silicon carbide and diamond as a function of annealing temperature.

We have now unexpectedly discovered that besides temperature, time plays an essential role in the development of microscopic, sub-surface microcracks essentially at the hydrogen concentration maximum and parallel to the surface and the formation of microcracks of a sufficient size to cause splitting before the development of optically detectable surface blisters or layer transfer in unbonded substrates or wafers. The occurrence of optically detectable surface blisters is associated with a well defined time at a given temperature for a given material and given hydrogen implantation parameters such as implantation dose and energy. FIG. 1 gives results of experiments involving the time required to develop optically detectable surface blisters in hydrogen implanted monocrystalline silicon, germanium, diamond and silicon carbide. The two, mirror polished substrates can only be properly bonded to each other if optically detectable surface blisters have not formed.

Figure 2:
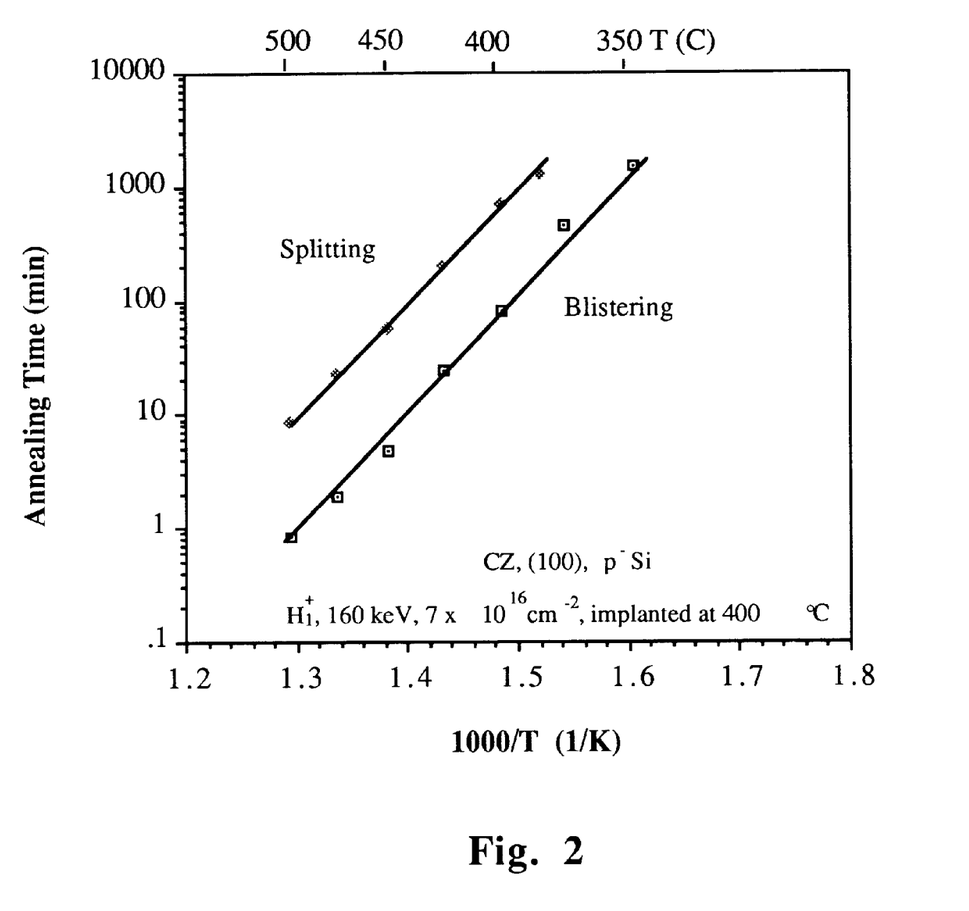
FIG. 2 Comparison between effective activation energies for the formation of hydrogen-induced optically detectable surface blisters in unbonded and for complete layer-splitting in bonded hydrogen-implanted silicon substrates after hydrogen implantation at 400 degrees centigrade.

The monocrystalline silicon, germanium, diamond and silicon carbide samples were implanted with $H_2^+$ at 120–160 keV with $5 \times 10^{16}$ $ions/cm^2$ (corresponding to $1 \times 10^{17}$ $cm^{-2}$ $H^+$ $ions/cm^2$) and annealed at various temperatures to introduce hydrogen filled microcracks. The maximum temperature during the implantation was controlled to stay below 200 degrees centigrade For the same implantation conditions but with bonded substrates it has been discovered that the transfer of the thin layer by splitting takes a longer time than the development of optically detectable surface blisters. In FIG. 2, the times required for layer transfer of a monocrystalline silicon layer are compared to those required for optically detectable surface blisters for the same hydrogen implantation conditions. In FIG. 2 the hydrogen was implanted at 400 degrees centigrade. It can be seen that times about a times a factor of ten times greater are required for the thin layer transfer for these hydrogen implantation conditions. The effective activation energy appears to be the same for both processes. For higher implantation energies, corresponding to an increased implantation depth, the times required for optically detectable surface blister appearance increase and get closer to those required for layer transfer. We also mention explicitly that the times required for the development of optically detectable surface blisters as well as the longer times required for layer transfer decrease with increasing hydrogen implantation dose and depend on the doping level of the material.

Since longer times at lower temperatures have been discovered to be equivalent, in terms of layer-splitting transfer, to shorter times at higher temperatures, methods to lower the hydrogen induced layer-splitting times required at a given temperature or to lower the splitting temperature for a given transfer time are required. It has been discovered that three methods, which may be used separately or in a combined way, can be used in order to accomplish shorter splitting times or lower splitting temperatures as are especially desirable for the application of this thin layer-splitting transfer method to substrates of substantially different coefficient of thermal expansion.

The first method consists of a low dose implantation of an element or elements which induce hydrogen-traps, such as boron in the case of silicon substrates. This hydrogen trap-inducing implantation induces damage in the monocrystalline first substrate by displacing substrate atoms to trap subsequently implanted hydrogen and later on release this hydrogen during a transfer heat-treatment. Depending on the specific element and the incident energy, one implanted ion can generate more than a thousand displaced atoms in the first substrate. Therefore, the dose of the hydrogen trap-inducing implantation can be in the range of 0.1% to about 1% of the dose of the subsequent hydrogen implantation. Since the defects are mostly vacancies and interstitials, they can recombine and be annealed out In order to take full advantage of the defects created during the hydrogen trap-inducing implantation, the temperature of the first substrate during both implantations must be controlled below that at which significant defect annealing takes place. The choice of the element implanted depends on the properties of the first substrate. In the case of silicon as the first substrate, boron ions are preferentially used because boron implantation has been well developed and is inexpensive. The residual boron in the transferred monocrystalline thin layers after the splitting can be removed by a polishing or by a thermal oxidation step in which boron is segregated into the grown oxide, which can then be removed by the application of dilute hydrofluoric acid. It is essential that the implanted ions do not generate an amorphous layer in the first substrate which extends up to its surface. As is known, amorphous layers produced by implantation begin first in a subsurface layer and not at the surface.

Figure 3:
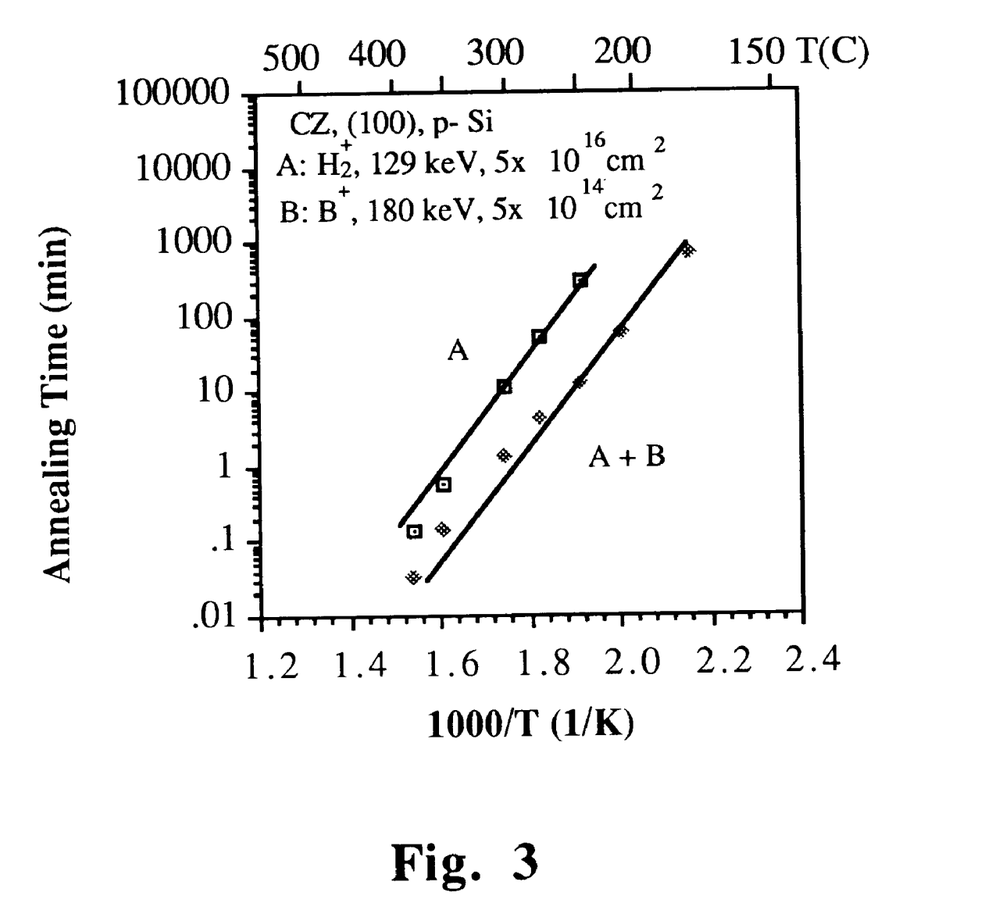
FIG. 3 The times required to form hydrogen-induced optically detectable surface blisters on the hydrogen only implanted silicon substrates ($H_2^+$ ions implanted at 129 keV with a dose of $5 \times 10^{16}$ $cm^{-2}$) and for boron implanted silicon substrates (implanted by $B^+$ at 180 keV with a dose of $5 \times 10^4$ $cm^{-2}$) followed by the same hydrogen implantation as in the first case ($H_2^+$ ions were implanted at 129 keV with a dose of $5 \times 10^{16}$ $cm^{-2}$) as a function of annealing temperature.

According to the present invention, the damage created by implantation in the first substrate to induce hydrogen-traps must be followed by a subsequent hydrogen implantation without an intermediate annealing treatment. The implanted hydrogen must be able to be trapped by the defects generated by the hydrogen trap-inducing implantation and to form defect structures which are stable up to a temperature higher than the hydrogen implantation temperature but below the temperature at which the bonded substrate structure degrades. Beyond a certain temperature the hydrogen will dissociate from the defect structures and become a mobile gas. According to the present invention, the trapping of hydrogen occurs by the reaction of the implanted hydrogen with silicon dangling bonds created by the first boron implant. In monocrystalline silicon the trapped hydrogen starts to become noticeably released during annealing at about 150 degrees centigrade. FIG. 3 shows in curve A the times required to form hydrogen-induced optically detectable surface blisters on the hydrogen-only implanted (100) oriented monocrystalline silicon substrates ($H_2^+$ ions at 129 keV with a dose of $5 \times 10^{16}$ cm$^{-2}$) and for comparison in curve (A+B) the times required to form hydrogen-induced optically detectable surface blisters in first boron implanted ($B^+$ at 180 keV with a dose of $5 \times 10^{14}$ cm$^{-2}$) and subsequently hydrogen implanted ($H_2^+$ ions were implanted at 129 keV with a dose of $5 \times 10^{16}$ cm$^{-2}$) (100) oriented monocrystalline silicon substrates as a function of annealing temperature. Compared to the hydrogen-only implanted silicon substrates, for the boron-implanted and subsequently hydrogen-implanted silicon substrates, the time of formation of optically detectable surface blisters at a given temperature or the temperature of blister generation for a given time are about ten times shorter or about 50 centigrade lower, respectively. The time for large area layer-splitting after bonding is about ten times longer but the effective activation energies for the two procedures remains essentially the same.

Figure 4:
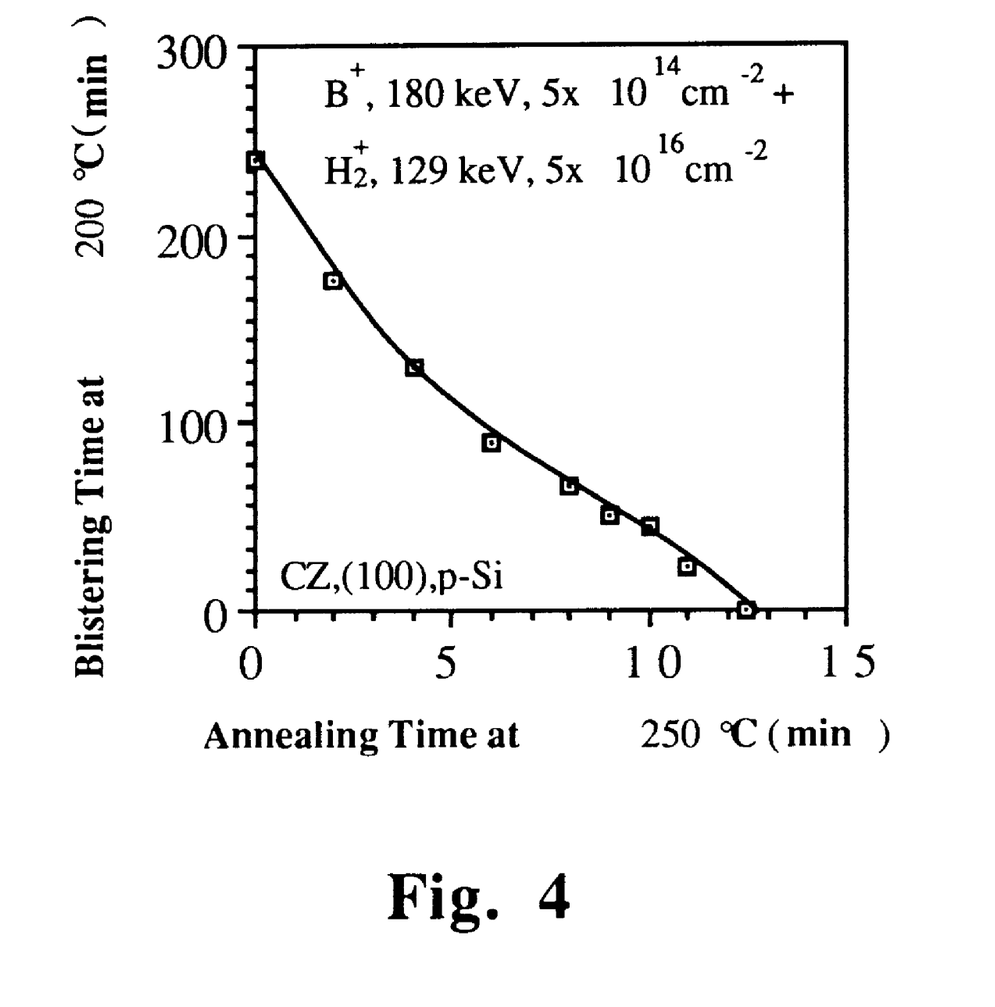
FIG. 4 The time needed for the formation of hydrogen-induced optically detectable surface blisters on boron and hydrogen implanted silicon substrates, as shown in FIG. 3, at 200 degrees centigrade as a function of the time of sensitizing heat-treatment at 250 degrees centigrade.

Additionally, to lower the layer-splitting temperature further, for a given layer-splitting time, or to reduce the layer-splitting time, at a given layer-splitting temperature according to the present invention, consists of the discovery that a sensitizing heat-treatment of the hydrogen implanted first substrate before wafer bonding to the second substrate lowers the layer-splitting temperature This sensitizing heat-treatment, which leads to the formation and growth of hydrogen-induced microcracks and facilitates splitting in the subsequent transfer heat-treatment after bonding, has to be limited to a time below that required for the formation of optically detectable surface blisters, which would prevent bonding. In the silicon case, the sensitizing heat-treatment of the unbonded boron and hydrogen implanted silicon substrates was carried out at 250 degrees centigrade. FIG. 2 shows the time needed at 200 degrees centigrade for the formation of optically detectable surface blisters in a boron implanted and subsequently hydrogen implanted silicon substrate as a function of the time of a sensitizing heat-treatment performed at 250 degrees centigrade. The implantation parameters for the boron and the hydrogen implantation are the same as given for the case of FIG. 4. The time for blistering decreases remarkably with increasing time of the sensitizing heat-treatment. For example, after a sensitizing heat-treatment at 250 degrees centigrade for 10 minutes the time to form optically detectable surface blisters is only ~10% of that required for blister formation in substrates which had not experienced a sensitizing heat-treatment.

Figure 5:
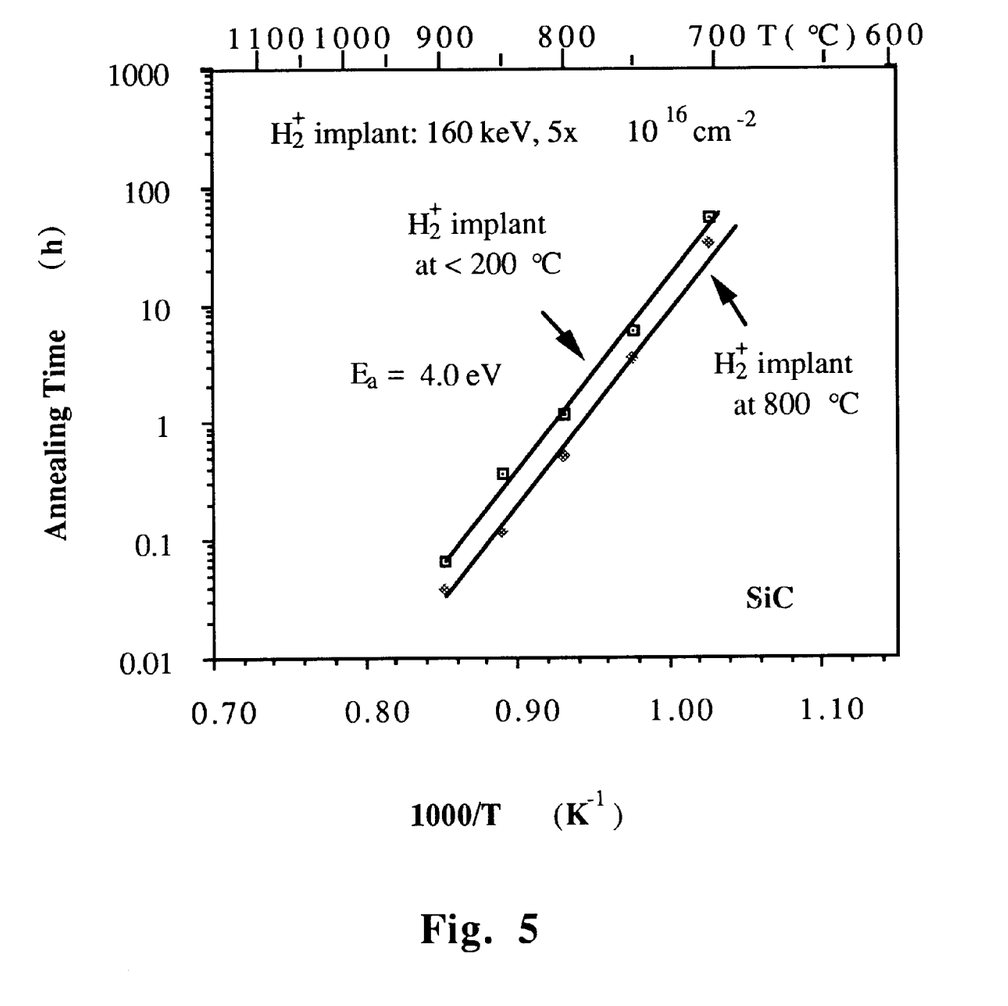
FIG. 5 Comparison between times for the formation of optically detectable surface blisters in silicon carbide wafers implanted by hydrogen at temperatures smaller than 200 degrees centigrade or at a temperature of 800 degrees centigrade.

A second method to lower the layer-splitting temperature for a layer-splitting time or to reduce the layer-splitting time at a given layer-splitting temperature according to the present invention, consists of carrying out the hydrogen implantation at temperatures which are higher than the temperature of heat-treatment after bonding as needed to transfer the thin layer. FIG. 5 shows that the times required for the formation of optically detectable surface blisters in silicon carbide substrates implanted with hydrogen at a temperature of 800 degrees centigrade are lower than those required for hydrogen implanted at temperatures smaller than 200 degrees centigrade with otherwise the same implantation parameters. The duration of the high temperature hydrogen implantation has to be chosen such that during the hydrogen implantation process, no hydrogen-induced optically detectable surface blisters are produced which would prevent suitable bonding to the second substrate. Since the required implantation times are determined by the implantation dose, the beam current of the implanter and the area of the monocrystalline material to be transferred, a wide range of values for the duration of an hydrogen implantation at elevated temperatures is available. This is especially true if one takes also into account the fact that new implantation techniques, such as plasma immersion ion implantation, allow high doses into large areas in very short implantation times as described by N. W. Cheung in his paper entitled "Plasma immersion ion implantation for semiconductor processing" which was published in the journal, Materials Chemistry and Physics in volume 46 in 1996 on pages 132 to 139. This technique allows the extension to even higher values for possible implantation temperatures, without the formation of hydrogen-induced optically detectable surface blisters.

Implantation at elevated temperatures has been developed especially for the implantation of oxygen in silicon to fabricate so-called SIMOX (Separation by IMplanted Oxygen) substrates, a special form of SOI materials, in order to improve material quality by limiting the amount of implantation damage by allowing the annealing of part of this damage during implantation as is known to practitioners of this field. Therefore, the proposed implantation at elevated temperatures for improved layer transfer of monocrystalline layers of hydrogen implanted materials does not pose a technological problem.

Implantation at elevated temperatures allows a reduction of the hydrogen implantation- induced damage by continuous annealing during the implantation process. It was confirmed that for lightly p-doped, (100) silicon the hydrogen implantation-induced damage is significantly reduced if the wafer temperature during implantation is kept higher than 450 degrees centigrade. In addition, a sharpening of the depth distribution of hydrogen implantation induced microcracks may be caused by the enhanced mobility of hydrogen during the hydrogen implantation at elevated temperatures, which in turn leads to a lower surface roughness of the transferred layer as compared to the presently used process where the implantation is performed at a lower temperature than the transfer heat-treatment as disclosed by Bruel in his U.S. Pat. No. 5,374,564.

According to the invention, all three methods lower the temperature of the layer transfer heat-treatment for a given time or reduce the required time of this heat-treatment at the given temperature needed for the layer-splitting transfer heat-treatment and they may be used alone or appropriately combined.

It has been found that a number of monocrystalline materials such as gallium arsenide and other III–V compounds do not show surface blister formation after the implantation of hydrogen in the parameter range which works for silicon, germanium, diamond and silicon carbide. In this case a transfer of a monocrystalline layer of this material, which may be, for example, gallium arsenide or gallium nitride, may be accomplished if this material can be epitaxially grown on an appropriate monocrystalline substrate, such as germanium in the case of gallium arsenide or silicon carbide in the case of gallium nitride, both of which show the effect of surface blistering after hydrogen implantation and a sufficiently long heat-treatment. In this case the energy of the implanted hydrogen has to be chosen in such a way that the maximum of the concentration depth distribution of implanted hydrogen does not lie within the monocrystalline epitaxial layer but in the monocrystalline first substrate in which then the hydrogen-induced microcracks will develop. Under these precautions the same basic procedures of layer transfer can be used as described above. The only difference is that after the layer transfer the monocrystalline layer transferred is covered with a second layer of monocrystalline material from the first substrate. This second monocrystalline layer has to be etched away with proper chemicals with a sufficiently high etch selectivity in order to not attack appreciably the underlying transferred monocrystalline thin layer.

In order to check whether there is a difference in hydrogen blister formation between implantations with $H^+$ and with $H_2^+$, in a separate set of experiments the two ions with approximately equivalent implant conditions ($H^+$: 60 keV, $1\times10^{17}$ ions/cm$^2$; $H_2^+$: 120 keV, $5\times10^{16}$ ions/cm$^2$) were implanted into silicon substrates. No differences in hydrogen-induced surface blister formation were found at temperatures above 218 degrees centigrade. It is believed that $H_2^+$ ion splits upon impact with the silicon substrate surface, coming to rest as a single hydrogen atom or ion. In addition to normal hydrogen, the hydrogen isotope deuterium may also be used.

DETAILED DESCRIPTION OF THE FIRST PREFERRED EMBODIMENT

The embodiment which will now be described, describes a method for the transfer of monocrystalline thin silicon layers from a monocrystalline silicon substrate onto a fused quartz substrate involving first hydrogen trap-inducing boron ion implantation into the silicon substrate followed by a hydrogen implantation into the same silicon substrate. The silicon substrate has a coefficient of thermal expansion which is substantially different from that of the fused quartz substrate.

The hydrogen trap inducing implantation of singly and positively charged boron ions at 180 keV with a dose of $5\times10^{14}$ cm$^{-2}$ in a 330 µm-thick monocrystalline silicon substrate with (100) crystallographic surface orientation, with the surface of the silicon substrate covered by a 1500 Å-thick thermal oxide, forms a boron depth concentration distribution with a maximum with a boron concentration of approximately $2\times10^9$ cm$^{-3}$ at a depth of approximately 0.58 µm. The concentration depth distribution of displaced silicon atoms is similar to the boron concentration depth distribution with a maximum concentration of approximately $2\times10^{22}$ cm$^3$ at a depth of the maximum slightly shallower than the maximum in the boron concentration distribution.

Molecular hydrogen $H_2^+$ ions are then implanted into the boron-implanted silicon substrate at 129 keV with a dose of $5\times10^{16}$ cm$^{-2}$ so that the concentration maximum of the two distributions of implanted boron and hydrogen are aligned with respect to the position of the maximum in their concentration depth distribution. The hydrogen concentration in the maximum is approximately $6\times10^{21}$ cm$^{-3}$ at a depth of approximately 0.58 µm. The temperature of the silicon wafers during both boron and hydrogen implantations were kept below 50 degrees centigrade. Micro-cracks parallel to the surface of the silicon substrate are formed already in the as-implanted silicon wafers at a location close to the maximum in the concentration depth distribution of the implanted hydrogen. This cracks effectively divide the silicon substrate into a thinner upper portion which constitutes the thin layer to be transferred and a thicker lower portion which constitutes the majority of the silicon substrate.

To avoid cracking of bonded silicon/quartz pairs a transfer temperature for the transfer heat-treatment during which growth and overlap of hydrogen induced microcracks and final transfer of the thin layer at or below approximately 200 degrees centigrade is required. However, it will take more than hundred hours to split the silicon layer at 200 degrees centigrade for the just implanted and bonded silicon and fused quartz substrates. Such a long transfer heat-treatment would induce the risk of degrading the bonded substrates due to thermal stresses in the substrates. For a further reduction of the splitting time, a sensitizing heat-treatment of the unbonded boron and hydrogen implanted silicon substrates is performed at 250 degrees centigrade for 10 minutes before bond ing which leads to the growth of hydrogen-filled microcracks but not yet to the formation of hydrogen-induced optically detectable surface blisters which Would prevent the subsequently required strong bonding by direct wafer bonding to the fused quartz substrate. This sensitizing heat-treatment allows to decrease the required time to transfer the thin monocrystalline silicon layer by layer-splitting at the transfer heat-treatment by about a factor of ten, as can be seen from FIG. 2, which shows that the time needed at 200 degrees centigrade for sufficiently large microcracks to cause generation of optically detectable surface blisters on substrates which had undergone a 10 minute sensitizing heat-treatment at 250 degrees centigrade is only ~10% of that required for silicon substrates which have not undergone a sensitizing heat-treatment.

Subsequently the boron and hydrogen implanted silicon substrate is bonded at room temperature by direct wafer bonding to a fused quartz substrate after both substrates have been cleaned by standard cleaning procedures used in the semiconductor industry. The bonded silicon/quartz pairs are then annealed at approximately 150 degrees centigrade to enhance the bond strength. A monocrystalline silicon layer of a thickness of about 0.58 μm corresponding to the depth of the maximum in the concentration depth distribution of implanted boron and hydrogen is then split from its substrate during a 200 degrees centigrade transfer heat-treatment for about 24 hours by the growth and overlap of hydrogen filled microcracks which leads to a macroscopical split of the upper portion constituting the thin monocrystalline layer from the lower portion of the silicon substrate and to its transfer to the fused quartz substrate. The boron concentration in the transferred silicon layer can subsequently be significantly reduced to a normal level by a light polishing and/or a thermal oxidation step.

The following table lists the conditions of boron ($B^+$) implantation followed by hydrogen ($H_2^+$) implantation for a first, bare monocrystalline silicon substrate to form various thicknesses of a monocrystalline silicon layer which may be transferred onto a desirable second substrate, such as a fused quartz substrate.

| Energy of $B^+$ ions (keV) | 70 | 128 | 180 | 215 | 520 |
|---|---|---|---|---|---|
| Energy of $H_2^+$ ions (keV) | 40 | 90 | 129 | 160 | 320 |
| Silicon layer thickness (μm) | 0.25 | 0.44 | 0.58 | 0.7 | 1.3 |

Using boron for the hydrogen trap inducing implantation is just an example. Since the implanted boron atoms are not electrically activated during the layer transfer, it is expected that an implant of ions of other appropriate elements or element combinations can play a similar role as boron atoms in hydrogen implanted silicon substrates. Another embodiment employs an element chosen from the list of carbon, phosphorus, nitrogen, arsenic and fluorine for the hydrogen trap inducing implantation.

Instead of $H_2^+$ ions any other kind of hydrogen ions may be used such as $H^+$, or the ions of the hydrogen isotope deuterium, $D^+$ or $D_2^+$.

DETAILED DESCRIPTION OF THE SECOND PREFERRED EMBODIMENT

The second embodiment which will now be described in conjunction with the above drawings relates to a method for the transfer of thin layers of monocrystalline silicon or silicon carbide or germanium layer on a substrate with the aid of an hydrogen ion implantation at elevated temperatures followed by wafer bonding and a subsequent heat-treatment at a temperature equal to or lower than that of the hydrogen implantation. Implantation of hydrogen ions may be performed either in the form of $H_2^+$ or in the form of $H^+$ or $D^+$. Both approaches may be used in terms of this invention.

Typical energies per hydrogen atom are in the order of 10 keV to 200 keV which leads in the case of monocrystalline silicon to depths of the implantation maximum of approximately 0.1 and 1.6 micrometers, respectively, which also corresponds to the thickness of the transferred monocrystalline silicon layer.

Much lower implantation energies such as only a few hundred eV, as they become available in commercial implanters for the fabrication of shallow junctions of dopants in silicon processing may also be used. Similarly much higher implantation energies of some MeV as also commercially available for buried layer implantation may also be used and are correspondingly associated with an implantation depth of tenths of micrometers.

Typical implantation doses (referring to the dose of single hydrogen atoms) are in the order of $2-20\times10^{16}$ cm$^{-2}$. For silicon and germanium the wafer temperature during implantation is in the range of 200 degrees centigrade to 800 degrees centigrade. For silicon carbide the wafer temperature during implantation is in the range of 500 degrees centigrade to 1,100 degrees centigrade.

We have performed various implantations at elevated temperatures and performed the layer transfer at lower temperatures. Two examples are described in the following.

In one case silicon carbide wafers were implanted with $H_2^+$ ions at 160 keV with a dose of $5\times10^{16}$ cm$^{-2}$ at a temperature of 800 degrees centigrade. The implantation time was 30 minutes which is short enough to avoid the development of optically detectable surface blisters (see FIG. 5).

The hydrogen implanted silicon carbide was then anodically bonded to a high temperature glass with a similar coefficient of thermal expansion at a temperature of 560 degrees centigrade. Subsequently, the bonded structure was heat treated at 725 degrees centigrade, which is below the hydrogen implantation temperature. The thin layer transfer was completed after a transfer heat-treatment of 100 hours. The surface smoothness as measured by atomic force microscopy was improved to 8 nm as compared to 15 nm for a thin layer of monocrystalline silicon carbide transferred after hydrogen implantation at a hydrogen implantation temperature less than 200 degrees centigrade.

We also implanted monocrystalline silicon substrates of (100) orientation with H+ions at 160 keV with a dose of $7\times10^{16}$ cm$^{-2}$ at a temperature of 400 degrees centigrade. The implantation time of 43 minutes was short enough to prevent the formation of optically detectable surface blisters (see FIG. 2). One piece of the silicon wafer implanted at 400 degrees centigrade was then directly bonded to an oxidized silicon substrate at room temperature by direct wafer bonding followed by a thermal treatment at 150 degrees centigrade to strengthen the bond between the two substrates a nd finally the thin monocrystalline silicon layer was split and transferred by a heat-treatment at 385 degrees centigrade, which is lower than the implantation temperature of 400 degrees centigrade. The layer transfer was completed after 5 hours of a transfer heat-treatment.

DETAILED DESCRIPTION OF THE THIRD PREFERRED EMBODIMENTS

The third embodiment relates to a preferred method for reducing the minimum hydrogen dose required for splitting of hydrogen-implanted layers of monocrystalline silicon or silicon carbide or germanium or other monocrystalline materials onto a substrate following bonding and subsequent heat treatment. It has now been discovered that this method allows successful splitting with lower hydrogen doses than that required normally for splitting In the Bruel's U.S. Pat. No. 5,374,564 it was indicated that a minimum H dose of about $5\times10^{16}$ cm$^{-2}$ is required for silicon layer splitting. A theoretical estimate of a lower bound of hydrogen dose required for layer splitting of about $2.8\times10^6$ cm$^{-2}$ for silicon was described by L. B. Freund in his paper entitled "A lower bound on implant density to induce wafer splitting in forming compliant substrates" which was published in the journal, Applied Physics Letters in volume 70 in 1997 on pages 3519 to 3521. In practice, typically a high hydrogen dose in the $5 \times 10^{16}$ to $1 \times 10^{17}$ cm$^{-2}$ range is us ed for implantation to achieve silicon layer splitting.

For mass production of transfer of thin layers of monocrystalline material onto a desired substrate, the fabrication cost is one of the main challenges. A reduction of hydrogen dose is essential not only for cost-effectiveness but also for a low density of defects in the split layers. Recently, it was reported that hydrogen implantation followed by helium implantation enables layer splitting at a lower total dose than that required for either hydrogen or helium alone as presented by A. Agarwal et al in their paper entitled "Efficient production of silicon-on-insulator films by co-implantation of He$^+$ with H$^+$" which was published in the journal, Applied Physics Letters in volume 72 in 1998 on pages 1086 to 1088. It was demonstrated that the minimum dose for silicon layer splitting was achieved by hydrogen implantation with a dose of $7.5 \times 10^{15}$ cm$^{-2}$ at 30 keV followed by helium implantation with a dose of $1 \times 10^{16}$ cm$^{-2}$ at 33 keV. However, the relatively high dose of helium can generate excessive damages in the host substrates which are difficult to be removed by subsequent thermal treatment.

We discovered that the minimum hydrogen dose required for splitting following bonding and subsequent heat treatment can be reduced by implanting boron (B$^+$) ions (dose $>1 \times 10^{12}$ cm$^{-2}$) on conjunction with hydrogen implantation, with both implantations performed at around room temperature, with the two ion profile peaks aligned or slightly offset. It has now been discovered that this procedure can significantly lower the splitting temperature of hydrogen-implanted layer of monocrystalline silicon or silicon carbide or germanium onto a substrate. This is termed B+H co-implanted samples. Implantation of hydrogen ions may be performed either in the form of H$_2^+$ or in the form of H$^+$ or D$^+$. At a fixed splitting temperature, a reduction of the required hydrogen dose for the layer splitting has been found when elements of Group III are implanted either before hydrogen implantation, or after hydrogen implantation, or at the same time as hydrogen implantation.

In a specific preferred embodiment, silicon samples were implanted by B$^+$ at 180 keV with a dose of $5 \times 10^{14}$ cm$^{-2}$ followed by H$^+$ implantation at 64.5 keV with a dose of $5 \times 10^{16}$ cm$^{-2}$ shows the similar splitting behavior as of silicon samples which were implanted by H$^+$ only with a dose of $1 \times 10^{17}$ cm$^{-2}$.

To determine the minimum H$^+$ dose for silicon layer splitting, H$^+$ was implanted at a fixed 64.5 keV with various doses from $1.2 \times 10^6$ cm$^{-2}$ to $1 \times 10^{17}$ cm$^{-2}$ into some silicon wafers following a fixed B$^+$ implantation at 180 keV with a dose of $5 \times 10^{14}$ cm$^{-2}$. Other silicon wafers were implanted with hydrogen only. In hydrogen-only implanted silicon, there was no blistering observed on the sample surfaces with H$^+$ doses less than $3.6 \times 10^{16}$ cm$^{-2}$ during annealing at elevated temperatures. However, on the B+H co-implanted silicon samples, blistering takes place with H$^+$ dose as low as $1.2 \times 10^{16}$ cm$^{-2}$ and an entire wafer-size Si layer was transferred on an oxidized silicon wafer to form a silicon-on-insulator (SOI) substrate wafer with H$^+$ dose of $2.8 \times 10^{16}$ cm$^{-2}$ by wafer bonding and layer splitting. We have found that Al (aluminium)+H co-implantation has the similar effect of B+H implantation in lowering minimum hydrogen dose for layer splitting. Other elements in group III, gallium, indium, and thallium, have a similar effect as boron and aluminium.

DETAILED DESCRIPTION OF THE FOURTH PREFERRED EMBODIMENT

The fourth preferred embodiment describes another method for lowering the minimum hydrogen dose required for splitting of hydrogen-implanted layers of monocrystalline silicon or silicon carbide or germanium or other monocrystallime material onto a substrate following bonding and subsequent heat treatment It has now been discovered that this reduction can be achieved by implanting hydrogen ions at high temperatures.

In a preferred embodiment, silicon was implanted with H$_2^+$ at 160 keV with a dose of $2.5 \times 10^{16}$ cm$^{-2}$. The silicon wafers had a (100) crystallographic surface orientation. The temperature of the silicon wafers during hydrogen implantation is preferably 300° C, but temperatures as low as 150° C. can be used. The silicon wafers which were implanted by hydrogen at 300° C. showed a splitting behavior similar to silicon samples which were implanted by H$_2^+$ at 160 keV at around room temperature with a dose of $3.5 \times 10^6$ cm$^{-2}$.

The maximum wafer temperature during hydrogen implantation for low hydrogen dose splitting of monocrystalline layers is material dependent. For silicon the maximum permitted temperature is about 500° C. and for silicon carbide it is about 900° C., for example. For diamond, the maximum permitted temperature is about 1200° C.

DETAILED DESCRIPTION OF THE FIFTH PREFERRED EMBODIMENTS

The fifth preferred embodiment presents a method for lowering the minimum hydrogen dose required for splitting of hydrogen-implanted layers of monocrystalline silicon or silicon carbide or germanium onto a substrate following bonding and subsequent heat treatment. This preferred method involves the co-implantation of boron ions at room temperature or at high temperature in conjunction with hydrogen ions implanted at high temperature.

Implanting B$^+$ ions (dose $>1 \times 10^{12}$ cm$^{-2}$) in conjunction with H$^+$ implantation at an elevated temperature, with the two ion profile peaks aligned or slightly offset has been found to reduce the minimum H dose required for layer splitting.

In this preferred embodiment B$^+$ was implanted 180 keV, with a dose of $5 \times 10^4$ cm$^{-2}$ at around room temperature into silicon wafers with a (100) crystallographic surface orientation together with H$_2^+$ implantation at 129 keV with a dose of only $1.0 \times 10^{16}$ cm$^{-2}$ at 300° C. Silicon wafer controls, implanted with H$_2^+$ at a fixed 129 keV but without boron implantation, were found to require H$_2^+$ doses of about $2.5 \times 10$ cm to achieve splitting. In contrast, entire wafer-size slicon layers were split and transferred from B+H(HT) co-implanted silicon wafers with a H$_2^+$ dose of only $1.0 \times 10^{16}$ cm$^{-2}$. onto an oxidized silicon wafers by wafer bonding and subsequent heat treatment.

The maximum wafer temperature during hydrogen implantation for low hydrogen dose splitting of monocrystalline layers is material dependent. For silicon the maximum permitted temperature is about 500° C. and for silicon carbide it is about 900° C., for example. For diamond, the maximum permitted temperature is about 1200° C. Other elements in group III, gallium, indium, and thallium, have a similar effect as boron and aluminium. In all cases, successful spitting can be achieved with hydrogen implantation doses less than less than $5 \times 10^{17}$ cm$^{-2}$.

What is claimed is:

1. A method for transferring an upper portion of a monocrystalline, first substrate to a second substrate, said method providing both a reduced level of hydrogen implantation dose requirement and a reduced splitting temperature requirement, said first substrate consisting of said upper portion and a lower portion, said lower portion constituting a majority of said first substrate and said upper portion having a surface which is essentially flat, said method consisting of the steps of:

subjecting said surface to a hydrogen trap-inducing implantation of one or more elements at a hydrogen trap-inducing implantation temperature which is kept below that temperature at which implantation-induced hydrogen-traps are annealed, said one or more elements selected from that group consisting of aluminum, gallium, indium, and thallium, said at least one element having an element depth distribution after implantation in said first substrate, said element depth distribution having an element concentration maximum, said element concentration maximum essentially dividing said first substrate into said upper portion and said lower portion, said hydrogen trap-inducing implantation having a dose less than $5 \times 10^{16}$ per square centimeter but greater than $1 \times 10^{10}$ per square centimeter; said hydrogen trap-inducing implantation being carried out in conjunction with hydrogen implantation;

subjecting said surface to a hydrogen implantation at a hydrogen implantation temperature, wherein said hydrogen implantation temperature is kept below that temperature at which implantation-induced hydrogen-traps are annealed, said hydrogen selected from that group consisting of normal hydrogen and deuterium, said hydrogen having a hydrogen depth distribution in said first substrate, said hydrogen distribution having a hydrogen concentration maximum, said hydrogen concentration maximum occurring essentially at said element concentration maximum, said hydrogen implantation being shorter in duration than that required to produce hydrogen-induced surface blisters, said hydrogen implantation being carried out in conjunction with hydrogen trap-inducing implantation;

subjecting said first substrate to a sensitizing heat-treatment at a sensitizing temperature below that temperature at which implantation-induced hydrogen-traps are annealed, for a time sufficient to form microscopic, sub-surface microcracks essentially at said hydrogen concentration maximum and parallel to said surface but shorter than that required to produce hydrogen-induced surface blisters;

bonding said surface of said first substrate to said second substrate to form a bonded structure by a bonding method chosen from anodic bonding and direct wafer bonding;

subjecting said bonded structure to a transfer heat-treatment at a transfer temperature, for a time sufficiently long to grow hydrogen induced microcracks which overlap in a region adjacent to said maximum in said hydrogen concentration distribution and which are essentially parallel to said surface, whereby said upper portion of said first substrate is separated by splitting from said lower portion and transferred to said second substrate.

2. A method for transferring an upper portion of a first substrate to a second substrate according to claim 1, wherein said first substrate is a monocrystalline substrate with an epitaxial layer.

3. A method for transferring an upper portion of a first substrate to a second substrate according to claim 1, wherein at least one of said first and said second substrates possesses at least one thin surface layer selected from that group of surface layers consisting of polycrystalline surface layers and amorphous surface layers.

4. A method for transferring an upper portion of a first substrate to a second substrate according to claim 2, wherein at least one of said first and said second substrates possesses at least one thin surface layer selected from that group of surface layers consisting of polycrystalline surface layers and amorphous surface layers.

5. A method for transferring an upper portion of a first substrate to a second substrate according to claim 1 wherein said first substrate is monocrystalline and said first substrate is selected from that group consisting of silicon carbide, silicon, germanium, diamond, germanium, and alloys essentially of silicon and germanium with carbon.

6. A method for transferring an upper portion of a first substrate to a second substrate according to claim 1, wherein said second substrate is selected from that group consisting of silicon, oxidized silicon, glass, fused quartz, sapphire, and silicon carbide.

7. A method for transferring an upper portion of a first substrate to a second substrate according to claim 5, wherein said second substrate is selected from that group consisting of silicon, oxidized silicon, glass, fused quartz, sapphire, and silicon carbide.

8. A method for transferring and bonding an upper portion of a first substrate to a second substrate according to claim 4 wherein said epitaxial layer is selected from that group of epitaxial layers consisting of III–V compound epitaxial layers.

9. A method for transferring and bonding an upper portion of a first substrate to a second substrate according to claim 4 wherein said first substrate is selected from the group of germanium and silicon carbide and said epitaxial layer is selected from that group of epitaxial layers consisting of gallium arsenide and gallium nitride epitaxial layers.

10. A method for the transfer of an upper portion of a monocrystalline, first substrate to a second substrate, said first substrate consisting of said upper portion and a lower portion, said lower portion constituting a majority of said first substrate and said upper portion having a surface which is essentially flat, said method consisting of the steps of:

subjecting said surface to a hydrogen implantation at a hydrogen implantation temperature above room temperature, said hydrogen implantation having a dose, wherein said hydrogen implantation temperature is greater than 150 degrees centigrade but less than above 250 degrees centigrade and said hydrogen implantation dose is less than $5 \times 10^{17}$ cm$^{-2}$, said hydrogen selected from the group consisting of normal hydrogen and deuterium, said hydrogen having a hydrogen concentration depth distribution in said first substrate, said hydrogen concentration depth distribution having a hydrogen concentration maximum, said depth concentration maximum essentially dividing said first substrate into said upper portion and said lower portion said hydrogen implantation being shorter in duration than that required to produce hydrogen-induced surface blisters, bonding said surface of said first substrate to said second substrate to form a bonded structure, said bonding selected from the group consisting of direct bonding and anodic bonding;

subjecting said bonded structure to a transfer heat-treatment treatment, said transfer heat-treatment treatment being carried out at a temperature which is less than said hydrogen implantation temperature for a sufficiently long time to grow hydrogen induced microcracks which overlap in a region adjacent to said maximum in said hydrogen concentration depth distribution which are essentially parallel to said surface, whereby said upper portion of said first substrate is separated by splitting from said lower portion and transferred to said second substrate.

11. A method for transferring an upper portion of a first substrate to a second substrate according to claim 10, wherein said first substrate is a monocrystalline substrate with an epitaxial layer.

12. A method for transferring an upper portion of a first substrate to a second substrate according to claim 10, wherein at least one of said first and said second substrates possesses at least one thin surface layer selected from that group of surface layers consisting of polycrystalline surface layers and amorphous surface layers.

13. A method for transferring an upper portion of a first substrate to a second substrate according to claim 11, wherein at least one of said first and said second substrates possesses at least one thin surface layer selected from that group of surface layers consisting of polycrystalline surface layers and amorphous surface layers.

14. A method for transferring an upper portion of a first substrate to a second substrate according to claim 10 wherein said first substrate is monocrystalline and said first substrate is selected from that group consisting of silicon carbide, silicon, germanium, diamond, germanium, and alloys essentially of silicon and germanium with carbon.

15. A method for transferring an upper portion of a first substrate to a second substrate according to claim 10, wherein said second substrate is selected from that group consisting of silicon, oxidized silicon, glass, fused quartz, sapphire, and silicon carbide.

16. A method for transferring an upper portion of a first substrate to a second substrate according to claim 10, wherein said hydrogen implantation temperature is greater than 150 degrees centigrade and less than above 250 degrees centigrade and said first substrate is essentially silicon.

17. A method for transferring an upper portion of a first substrate to a second substrate according to claim 10, wherein said hydrogen implantation temperature is greater than 150 degrees centigrade and less than above 250 degrees centigrade and said first substrate is essentially silicon carbide.

18. A method for transferring and bonding an upper portion of a first substrate to a second substrate according to claim 11 wherein said epitaxial layer is selected from that group of epitaxial layers consisting of III–V compound epitaxial layers.

19. A method for transferring and bonding an upper portion of a first substrate to a second substrate according to claim 13 wherein said epitaxial layer is selected from that group of epitaxial layers consisting of III–V compound epitaxial layers.

20. A method for transferring and bonding an upper portion of a first substrate to a second substrate according to claim 19 wherein said first substrate is selected from the group of germanium and silicon carbide and said epitaxial layer is selected from that group of epitaxial layers consisting of gallium arsenide and gallium nitride epitaxial layers.

21. A method for transferring an upper portion of a monocrystalline, first substrate to a second substrate, said method providing both a reduced level of hydrogen implantation dose requirement and a reduced splitting temperature requirement, said first substrate consisting of said upper portion and a lower portion, said lower portion constituting a majority of said first substrate and said upper portion having a surface which is essentially flat, said method consisting of the steps of:

subjecting said surface to a hydrogen trap-inducing implantation of one or more elements, said one or more elements selected from that group consisting of boron, aluminum, gallium, indium, and thallium, said at least one element having an element depth distribution after implantation in said first substrate, said element depth distribution having an element concentration maximum, said element concentration maximum essentially dividing said first substrate into said upper portion and said lower portion, said hydrogen trap-inducing implantation having a dose less than $5\times10^{16}$ per square centimeter but greater than $1\times10^{10}$ per square centimeter, said hydrogen trap-inducing implantation being carried out in conjunction with hydrogen implantation;

subjecting said surface to a hydrogen implantation of less than $5\times10^{17}$ cm$^{-2}$ at a hydrogen implantation temperature, wherein said hydrogen implantation temperature is above 150° C. but below 1200° C., said hydrogen selected from that group consisting of normal hydrogen and deuterium, said hydrogen having a hydrogen depth distribution in said first substrate, said hydrogen distribution having a hydrogen concentration maximum, said hydrogen concentration maximum occurring essentially at said element concentration maximum, said hydrogen implantation being shorter in duration than that required to produce hydrogen-induced surface blisters, said hydrogen implantation being carried out in conjunction with hydrogen trap-inducing implantation;

subjecting said first substrate to a sensitizing heat-treatment at a sensitizing temperature below that temperature at which implantation-induced hydrogen-traps are annealed, for a time sufficient to form microscopic, sub-surface microcracks essentially at said hydrogen concentration maximum and parallel to said surface but shorter than that required to produce hydrogen-induced surface blisters;

bonding said surface of said first substrate to said second substrate to form a bonded structure by a bonding method chosen from anodic bonding and direct wafer bonding;

subjecting said bonded structure to a transfer heat-treatment at a transfer temperature, for a time sufficiently long to grow hydrogen induced microcracks which overlap in a region adjacent to said maximum in said hydrogen concentration distribution and which are essentially parallel to said surface, whereby said upper portion of said first substrate is separated by splitting from said lower portion and transferred to said second substrate.

22. A method for transferring an upper portion of a first substrate to a second substrate according to claim 21, wherein said first substrate is a monocrystalline substrate with an epitaxial layer.

23. A method for transferring an upper portion of a first substrate to a second substrate according to claim 21, wherein at least one of said first and said second substrates possesses at least one thin surface layer selected from that group of surface layers consisting of polycrystalline surface layers and amorphous surface layers.

24. A method for transferring an upper portion of a first substrate to a second substrate according to claim 22, wherein at least one of said first and said second substrates possesses at least one thin surface layer selected from that group of surface layers consisting of polycrystalline surface layers and amorphous surface layers.

25. A method for transferring an upper portion of a first substrate to a second substrate according to claim 21 wherein said first substrate is monocrystalline and said first substrate is selected from that group consisting of silicon carbide, silicon, germanium, diamond, germanium, and alloys essentially of silicon and germanium with carbon.

26. A method for transferring an upper portion of a first substrate to a second substrate according to claim 21, wherein said second substrate is selected from that group consisting of silicon, oxidized silicon, glass, fused quartz, sapphire, and silicon carbide.

27. A method for transferring an upper portion of a first substrate to a second substrate according to claim 21, wherein said hydrogen implantation temperature is greater than 200 degrees centigrade and less than 800 degrees centigrade and said first substrate is essentially silicon.

28. A method for transferring an upper portion of a first substrate to a second substrate according to claim 21, wherein said hydrogen implantation temperature is greater than 500 degrees centigrade and less than 1200 degrees centigrade and said first substrate is essentially silicon carbide.

29. A method for transferring and bonding an upper portion of a first substrate to a second substrate according to claim 11 wherein said epitaxial layer is selected from that group of epitaxial layers consisting of III–V compound epitaxial layers.

30. A method for transferring and bonding an upper portion of a first substrate to a second substrate according to claim 24 wherein said epitaxial layer is selected from that group of epitaxial layers consisting of III–V compound epitaxial layers.

31. A method for transferring and bonding an upper portion of a first substrate to a second substrate according to claim 30 wherein said first substrate is selected from the group of germanium and silicon carbide and said epitaxial layer is selected from that group of epitaxial layers consisting of gallium arsenide and gallium nitride epitaxial layers.

* * * * *